United States Patent
Avraham

(10) Patent No.: US 6,715,041 B2
(45) Date of Patent: Mar. 30, 2004

(54) NON-VOLATILE MEMORY DEVICE WITH MULTIPLE PORTS

(75) Inventor: Meir Avraham, Rishon-le-zion (IL)

(73) Assignee: M-Systems Flash Disk Pioneers Ltd., Kfar Saba (IL)

(*) Notice: Subject to any disclaimer, the term of this patent is extended or adjusted under 35 U.S.C. 154(b) by 193 days.

(21) Appl. No.: 10/056,486

(22) Filed: Jan. 28, 2002

(65) Prior Publication Data

US 2003/0145153 A1 Jul. 31, 2003

(51) Int. Cl.⁷ .................. G06F 13/16; G06F 12/06; G06F 12/14
(52) U.S. Cl. .................. 711/149; 711/103; 710/36; 365/185.33
(58) Field of Search .................. 710/1, 4, 36, 38, 710/62, 316; 711/102, 103, 149, 151, 163; 365/185.33

(56) References Cited

U.S. PATENT DOCUMENTS 5,048,101 A * 9/1991 Kurosu et al. .............. 382/305
6,559,859 B1 * 5/2003 Henry et al. .............. 345/690
2003/0070024 A1 * 4/2003 Su et al. .............. 710/300

FOREIGN PATENT DOCUMENTS

EP  1043894 A2 * 10/2000

* cited by examiner

Primary Examiner—B. James Peikari
(74) Attorney, Agent, or Firm—Mark M. Friedman

(57) ABSTRACT

A device, a method and a system for reading/writing data, preferably of a particular type, from a first dedicated port of a NVM storage, while other data is reading/written to at least a second general port of the NVM storage. Preferably, while data is being continually read/written through the dedicated port of the NVM storage, the logic processor which controls the NVM storage optionally "sleeps", or reverts to a lower power consumption mode. The NVM storage of the present invention may optionally feature a plurality of ports, as long as at least one dedicated port for reading/writing data, preferably of a particular type, and at least one general port for reading/writing data, is provided. According to preferred embodiments of the present invention, the at least one dedicated ports is a port for reading/writing streamed data, such as streaming audio and/or video data for example.

17 Claims, 2 Drawing Sheets

NON-VOLATILE MEMORY DEVICE WITH MULTIPLE PORTS

FIELD OF THE INVENTION

The present invention relates to a device, a system and a method for a non volatile memory (NVM) device with at least two ports, in which at least one port is for general data access, while at least one additional port is dedicated for reading/writing a particular type of data from the NVM. A preferred example of the NVM device is implemented with a flash disk.

BACKGROUND OF THE INVENTION

NVM devices have many different uses, including data storage for portable devices or other devices in which storage size, weight and/or power consumption is a factor. As shown with regard to background art FIG. 1, a typical NVM device 10 features a single port 12 for accessing data, including both reading and writing data. The data itself is stored in a NVM media 14, which is accessible by a logic processor 16 of some type, such as a CPU for example, through single port 12. Logic processor 16 is able to read and write data through single port 12, by communicating with NVM media 14 through a NVM controller 18 (which logic processor may also communicate with an external device, such as a video processor 20). However, logic processor 16 cannot simultaneously read data from and write data to NVM media 14 or read from 2 different locations in NVM media 14. Thus, if logic processor 16 is in the middle of a process of reading from or writing to one location in NVM media 14, and then receives a request to retrieve data from another location in NVM media 14, the first process must be stopped before the second request can be processed.

Such a requirement for only reading from, or only writing data to, NVM media 14, may not be important for data operations which involve reading/writing discrete segments of data. However, for operations which may require continuous reading operations, such as reading video and/or audio stream data from NVM media 14 for example, interruptions to the reading streamed data process are clearly detrimental. Furthermore, the current implementation of the NVM storage according to background art FIG. 1 has major drawbacks. For example, if NVM storage 14 includes two types of data, a first regular type of data that is required by logic processor 16, and a second type of streamed data that is required by another element in the system. Since only one element can be connected to NVM storage 10, logic processor 16 is used as a bridge between other components of the system and NVM storage 10, causing extra delays and additional power consumption which may be detrimental, for example for portable devices with limited power supply. Unfortunately, there is currently no solution to this problem.

SUMMARY OF THE INVENTION

The background art does not teach or suggest a device, system or method which enables data to be continually read from a NVM storage device, without requiring the logic processor, such as a CPU, to operate continuously. In addition, the background art does not teach or suggest a device, system or method which enables data to be read from a NVM, without interrupting this process when data is to be written to the NVM.

The present invention overcomes these deficiencies of the background art, by providing a device, a method and a system for reading\writing data of a particular type from a first dedicated port of a NVM storage device, while data is read\written to at least a second general port of the NVM storage device. Preferably, while data is being continually read through the dedicated port of the NVM storage, the logic processor which controls the NVM storage device optionally "sleeps", or reverts to a lower power consumption mode.

The NVM storage device of the present invention may optionally feature a plurality of ports, as long as at least one dedicated port for reading data, preferably of a particular type, and at least one general port for reading/writing data, is provided. According to preferred embodiments of the present invention, the at least one dedicated port is a port for reading/writing streamed data, such as streaming audio and/or video data for example. Most preferably, the dedicated port is for reading streaming audio data, such as MP3 file data for example, for providing a portable audio player.

According to the present invention, there is provided a NVM storage device for dedicated reading of data, comprising: (a) a general port for reading and writing data; (b) a dedicated port for dedicated reading/writing of data; (c) an internal controller for receiving a command for dedicated data; and (d) a media such as a flash memory for storing the data, such that the data is read/written when the command for dedicated data is received by the internal storage controller and such that the data is transferred through the dedicated port.

According to another embodiment of the present invention, there is provided a portable device for dedicated reading of data, comprising: (a) a non-volatile memory component for storing at least one data file, the non-volatile memory component featuring a general port for reading and writing data, and a dedicated port for dedicated reading\writing of data; and (b) a CPU for transmitting a command to the non-volatile memory component to read\write the dedicated data.

According to another embodiment of the present invention, there is provided a method for reading dedicated data, comprising: providing a portable device for dedicated reading of data, the portable device comprising: a non-volatile memory component for storing at least one data file, the non-volatile memory component featuring a general port for reading and writing data, and a dedicated port for dedicated reading of data; sending a command to the non-volatile memory component to read the dedicated data through the dedicated port; and reading the dedicated data through the dedicated port.

BRIEF DESCRIPTION OF THE DRAWINGS

The foregoing and other objects, aspects and advantages will be better understood from the following detailed description of a preferred embodiment of the invention with reference to the drawings, wherein.

DETAILED DESCRIPTION OF THE INVENTION

The present invention is of a device, a method and a system for accessing data, preferably of a particular type, from a first dedicated port of a NVM storage device such as a flash disk for example, while other data is accessed through at least a second general port of the NVM device. Preferably, while data is being continually accessed through the dedicated port of the NVM storage device, the logic processor which controls the NVM storage device optionally "sleeps", or reverts to a lower power consumption mode.

The NVM storage device of the present invention may optionally feature a plurality of ports, as long as at least one dedicated port for accessing data, preferably of a particular type, and at least one general port for reading/writing general data, is provided. According to preferred embodiments of the present invention, the at least one dedicated port is a port for accessing streamed data, such as streaming audio and/or video data for example. Most preferably, the dedicated port is for accessing streaming audio data, such as MP3 file data, for example for providing a portable audio player.

The principles and operation of a device, a system and a method according to the present invention may be better understood with reference to the drawings and the accompanying description, it being understood that these drawings are given for illustrative purposes only and are not meant to be limiting. Furthermore, although the following description centers around a flash memory, it is understood that the description would be applicable to any type of non-volatile memory component.

Figure 1:
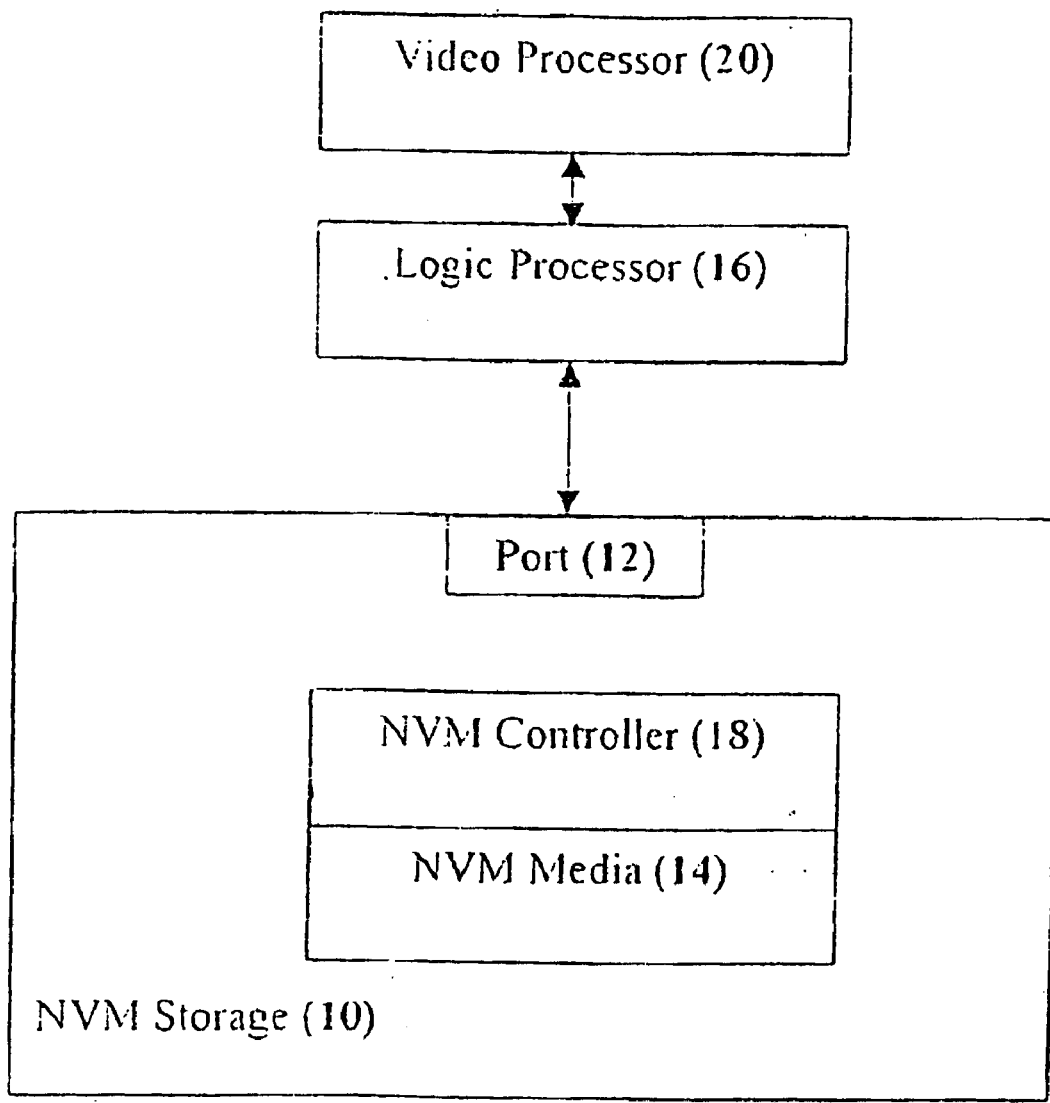
FIG. 1 is a schematic block diagram of a background art flash disk.
Figure 2:
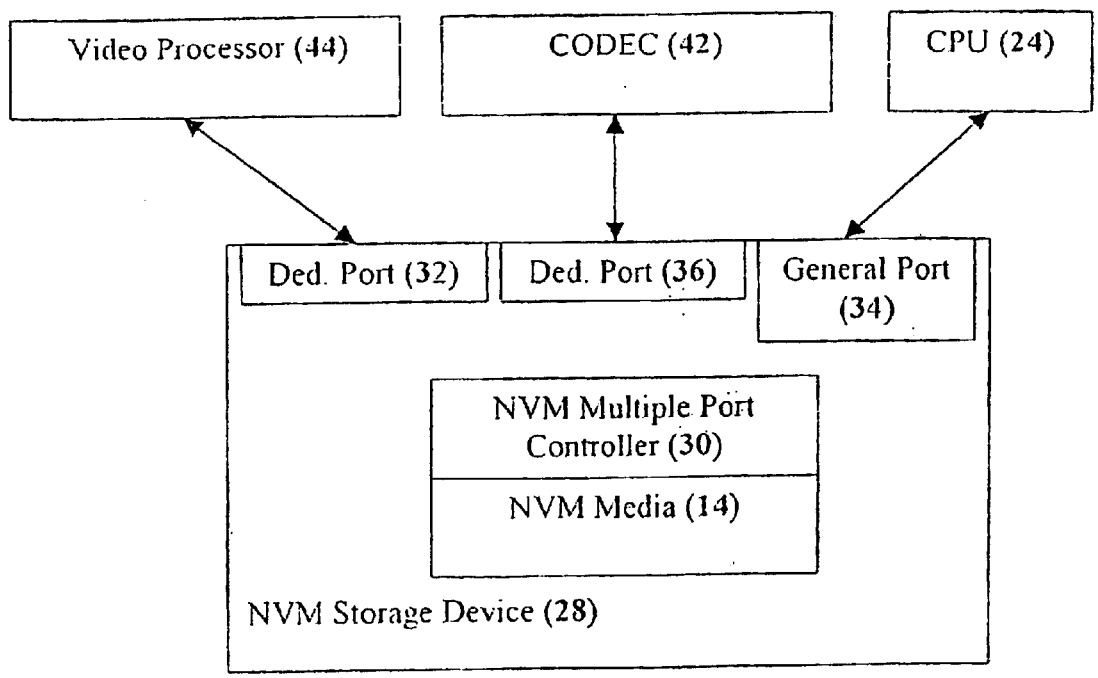
FIG. 2 is a schematic block diagram of an exemplary portable device and system according to the present invention.

Referring now to the drawings, FIG. 2 is a schematic block diagram of an illustrative, exemplary portable device according to the present invention. A portable device 22 features a CPU 24 for executing instructions, such as a request to read data for example. CPU 24 is optionally a microprocessor. CPU 24 is more preferably able to read these instructions from a NVM storage device 28, which is optionally a flash disk according to the present invention. Again, it should be noted that the flash disk is a non-limiting, illustrative example of a type of NVM storage media which could optionally be used for implementation of the present invention.

NVM storage device 28 differs from the background art flash disk in that NVM storage device 28 features a plurality of ports, including at least one dedicated port 32 and at least one general port 34. General port 34 is used for reading or writing data of a plurality of data types from/to NVM storage device 28. Dedicated port 32 is used for accessing only one data type from/to NVM storage device 28. By "data type" it is meant a particular class or category of data, which is optionally and more preferably defined according to the application generating and/or reading and/or otherwise being capable of displaying and/or accessing the data. For example, one type of data is optionally audio data, which may optionally be played back by an audio application. The exact type of data which is associated with each dedicated port may easily be selected by one of ordinary skill in the art. Preferably, general port 34 is capable of transmitting, for reading and/or writing, a plurality of different types of data.

A third dedicated port 36 may optionally be present as shown. Other dedicated ports may optionally also be present (not shown).

Dedicated port 36 is dedicating to reading/writing data from NVM storage device 28, preferably a particular type of data, and more preferably streaming data, such as streaming audio. Dedicated port 36 is preferably connected to a system element such as a CODEC (encoder/decoder) 42 and/or other element for reading audio data, which is an example of a processing module for processing data read from NVM media 14 through dedicated port 36. The system may include another dedicated port 32 for other elements such as video processor 44, for example. Video processor 44 is another example of a processing module for processing data read from NVM media 14, in this case through a different dedicated port (dedicated port 32).

Although CODEC 42 and video processor 44 are shown as separate components from NVM storage 28, this is for the purposes of illustration only and is without any intention of being limiting. CODEC 42 and/or video processor 44 are optionally implemented as part of NVM storage device 28, and/or as part of a separate ASIC which controls NVM storage device 28 (not shown).

When the user wishes to read data of a type which can be read through dedicated port 36, such as streaming audio data for example, CPU 24 sends the initial address of the data to be read and also the length or amount of data which is required to NVM multiple port controller 30. CPU 24 then optionally and preferably enters a "sleep" or reduced power consumption mode, for example until another command is received and/or the full amount of data has been read.

NVM multiple port controller 30 now starts to read the data from NVM media 14, and to transmit this data through dedicated port 36. This data is then optionally processed by CODEC 42, before being transmitted to the user.

Once the full data has been read, or at least a significant portion of the data has been read, NVM multiple port controller 30 preferably generates an interrupt signal in order to "wake" CPU 24, or at least to cause CPU 24 to leave the reduced power consumption mode. CPU 24 preferably then queries NVM multiple port controller 30 as to the status of the data being read, particularly with regard to the address of the data which is currently being read. Optionally and more preferably, CPU 24 then alerts the user as to the status of the data being read. Most preferably, CPU 24 then loads another set of streaming data, according to the selection of the user, again by sending the initial address and length of the data to NVM multiple port controller 30. If the set of streaming data is not present at contiguous addresses, then optionally and most preferably, CPU 24 points to the next address of the streaming data to be read.

It will be appreciated that the above descriptions are intended only to serve as examples, and that many other embodiments are possible within the spirit and the scope of the present invention.

What is claimed is:

1. A NVM storage device, comprising:
   (a) a general port for transfer of data of a plurality of data types;
   (b) at least one dedicated port for transfer of dedicated data of a particular data type;
   (c) an internal controller for controlling transfer of data through said general port and through said at least one dedicated port; and
   (d) a NVM storage media for storing the data, wherein when said internal controller receives a command for transferring data of said particular data type through said dedicated port, said internal controller selectively causes transfer of data of said particular data type between said at least one dedicated port and said NVM storage media.

2. The device of claim 1, wherein said at least one dedicated port is dedicated for accessing data of a particular data type from said NVM storage media, such that said internal controller selectively causes said data of said particular data type to be accessed through said at least one dedicated port upon receiving said command.

3. The device of claim 2, further comprising:

(e) a processing module for processing the data of said particular data type after the data is read through said at least one dedicated port.

4. The NVM storage device of claim 3, wherein said processing module is a CODEC.

5. The NVM storage device of claim 2, wherein the data of said particular data type is selected from the group consisting of audio data and video data.

6. The NVM storage device of claim 1, wherein said NVM storage media is a flash memory component.

7. The NVM storage device of claim 1, further comprising a CPU for sending said command to said internal controller for transferring said data of said particular data type, wherein said CPU enters a sleep mode as said data of said particular data type is being transferred.

8. The NVM storage device of claim 7, wherein said CPU leaves said sleep mode when transfer of said data of said particular data type is complete.

9. A portable device for dedicated reading of data, comprising:

(a) a non-volatile memory component for storing at least one data file, said non-volatile memory component featuring a first port for reading and writing data of at least one data type, and a dedicated port for accessing data of a second data type; and (b) a CPU for transmitting a command to said non-volatile memory component to access the dedicated data of said second data type through said dedicated port, wherein only data of said second data type may pass through said dedicated port.

10. The device of claim 9, further comprising an internal controller for receiving said command to access the dedicated data through said dedicated port and for controlling said dedicated port and said first port.

11. The device of claim 9, wherein said non-volatile memory component at least includes a flash memory component.

12. The device of claim 9, further comprising:

(c) a processing module for processing data of said second data type after the data is read through said dedicated port.

13. The device of claim 12, wherein said processing module is a CODEC.

14. The device of claim 13, wherein the data is streaming audio data.

15. A storage device for dedicated accessing of data, comprising:

(a) a non-volatile memory component for storing at least one data file, said non-volatile memory component featuring a first port for reading and writing data, and a second port for only accessing dedicated types of data; and (b) a CPU for at least transmitting a command to said non-volatile memory component to read data through said second port.

16. A storage device, comprising:

(a) a non-volatile memory component for storing at least one data file, said non-volatile memory component featuring a general port for transferring data of a plurality of data types, and a dedicated port for only transferring data of a particular data type; and (b) a CPU for at least transmitting a command to said non-volatile memory component to transfer said data of said particular data type through said dedicated port.

17. A method for reading stored data, comprising:

providing a portable device for dedicated accessing of data, said portable device comprising: a non-volatile memory component for storing at least one data file, said non-volatile memory component featuring a general port for reading and writing data, and at least one dedicated port for dedicated accessing of data;

sending a command to said non-volatile memory component to access the data through said dedicated port; and accessing the data through said dedicated port.

* * * * *